United States Patent [19]

Tripp

[11] 3,995,267

[45] Nov. 30, 1976

[54] DIGITAL TO ANALOG CONVERTER WITH SYSTEM GAIN INSENSITIVITY

[75] Inventor: Robert W. Tripp, Tuckahoe, N.Y.

[73] Assignee: Inductosyn Corporation, Valhalla, N.Y.

[22] Filed: May 29, 1975

[21] Appl. No.: 581,996

[52] U.S. Cl. .................. 340/347 DA; 340/347 SY; 318/660
[51] Int. Cl.² ...................................... H03K 13/00
[58] Field of Search .......... 318/660, 603, 604, 605; 235/151.11; 340/347 SY, 347 DA; 328/27

[56] References Cited
UNITED STATES PATENTS 3,247,504  4/1966  Emmerich.................... 318/660 X
3,745,560  7/1973  Tripp .......................... 340/347 DA Primary Examiner—Charles D. Miller
Attorney, Agent, or Firm—John L. Downing

[57] ABSTRACT

A position-measuring system in which an improved digital to analog converter accepts an error signal from a position measuring transducer, the error signal being processed to be a digital signal representation of the magnitude and two-state direction of a positional error. The system is constructed to operate as if the error signal input had three states, two directional states and an intermediate "dead zone."

11 Claims, 5 Drawing Figures

DIGITAL TO ANALOG CONVERTER WITH SYSTEM GAIN INSENSITIVITY

BACKGROUND OF THE INVENTION

1. Field of the Invention:

The present invention relates to the field of position measuring systems, and particularly to such systems employing digital-to-analog converters for accepting digital inputs and responsively providing analog signals to position-measuring devices such as Inductosyn transducers, for position control and position readout applications.

2. Description of the Prior Art:

One such prior art converter is described in Tripp U.S. Pat. No. 3,686,487. In that patent a digital sine/cosine generator is disclosed in which a clock signal is counted down through parallel first and second counters. A generation means is provided for accepting a digital input of $n$ bits corresponding to an error signal generator by the transducer representative of a change in the relative position of two members of an Inductosyn position measuring transducer and responsively generating a difference in count between the two counters equal to the digital input, so as to relatively phase shift the outputs of the two counters. The relatively phase-shifted counter outputs are then logically combined to form one or more pulse-width modulated rectangular wave signals which are used to excite the windings of the transducer. In that converter the first and second counters have a count range of N, so that for a digital of $n$ bits each of the pulse-width modulated signals includes a fundamental frequency component having an amplitude proportional to a trigonometric function (e.g. sine or cosine) of an angle $\theta$, where $\theta$ equals $(n/N)360°$.

The above-noted converter is typically used to divide the periodic measurement cycle of an Inductosyn transducer into N parts. For example, for a typical Inductosyn transducer cycle of 0.2 inch (5.08 mm.), and for first and second counters having a count range of 2000, the 0.2 inch cycle is divided into 2000 parts, i.e., each digital bit of the count range represents $1 \times 10^{-4}$ inch ($2.54 \times 10^{-3}$ mm.).

In such position measurement systems two basic configurations are generally employed. In the first configuration the error signal is detected as being in one of two error states (positive or negative) with no intermediate dead zone in which the error signal may vary with no corresponding change in converter output. Such a system requires constant correction, and as a result stabilization is difficult. The second common configuration uses a three-state error signal which is detected as being positive, zero, or negative. In the intermediate zero state no corrections to the system are made. As a consequence, this type of system is more easily stabilized, but the stabilization is a function of overall system gain. For example, if the system gain is very high the predetermined magnitude of the error signal zero state becomes relatively insignificant, and in effect a two-state error signal configuration is attained. However, if the system gain is very low, the intermediate error signal zero state becomes relatively large, and large positional errors must occur before the positive or negative states ar detected and positional correction instituted.

SUMMARY OF THE PRESENT INVENTION

The present invention provides an improvement in converter apparatus to permit a position-measurement system to be used in a two-state error signal configuration to minimize system gain sensitivity, while at the same time simulating a system with a three-state error signal configuration by changing the analog command position signal output by a predetermined value whenever the error signal switches between its two directional states, thereby producing a system with improved stability.

To achieve this result digital-to-analog converter apparatus is provided for supplying an analog signal to a position-measurement transducer, the transducer generating an error signal having two directional states. The coverter apparatus has a source of clock pulses and means responsive to the error signal for generating a source of digital pulses representative of the error signal. Circuit means responsive to the clock pulses and input pulses are provided for generating first and second trains of stepping pulses, the difference in the number of pulses in said first and second trains being a function of said error signal. First and second counters, responsive to the first and second trains of stepping pulses, respectively, count and register the stepping pulses cyclically through a count range. The converter apparatus also includes means for delaying the count registering signals from the first counter for a predetermined delay time whenever the error signal is in a first of its two directional states, and means for logically combining the count registering signals from the first counter with count registering signals from the second counter to form the analog signal.

With this arrangement the converter of the present invention accepts a two-state digital error signal and generates a pulse-width modulated analog signal in response thereto. The width of the analog signal is normally altered by one bit period of the clock for each error input pulse. By reason of the predetermined delay which is introduced in the first counter the output signals from that counter, depending upon the directional state of the error signal (UP or DOWN), are either delayed in time by a time equivalent to that which would be produced by adding a predetermined number of bits (greater than one) to the counter (1.3 bits in the embodiment described hereafter), or not delayed. Therefore, when the analog signals exciting the position-measuring transducer correspond to the actual position of the transducer (i.e., when the error signal is at a null and the error signal changes its directional state) the delayed output from the first counter causes the equivalent of a greater than one bit change (e.g., 1.3 bits in the described embodiment) in the width of the analog signal output instead of a one bit change. This relatively increased change in the converter output whenever the error signal changes direction causes the position measuring system of act as through a dead zone (0.3 bit) existed between the UP and DOWN error signal directional states, and oscillation about this error signal null tends to be stabilized or damped. Thus, a three-state error input is simulated to improve system stability, but in fact a two-state error signal is retained so that no system gain sensitivity is introduced.

The converter of the system also includes circuitry for decreasing the rate at which the error signal is sampled whenever the error signal is in a transitional phase between its two directional states. This feature also improves the reliability and stability of the position measuring system.

Finally, the invention provides improved and simplified circuitry for stepping the counters in the converter to eliminate phase walk between the analog signal outputs and reference counter output while retaining a high clock frequency.

In general it has been observed that the stability of the position measurement system about the error signal null state tends to improve with the increase of the absolute magnitude of the change in the analog output signal (above 1 bit) with each error signal sample, and with the decrease in the system's sampling rate. Either or both of these system parameters can be adjusted to affect the stability of system performance when the error signal is at or near its null state.

DESCRIPTION OF THE EMBODIMENT

General Description

Figure 1:
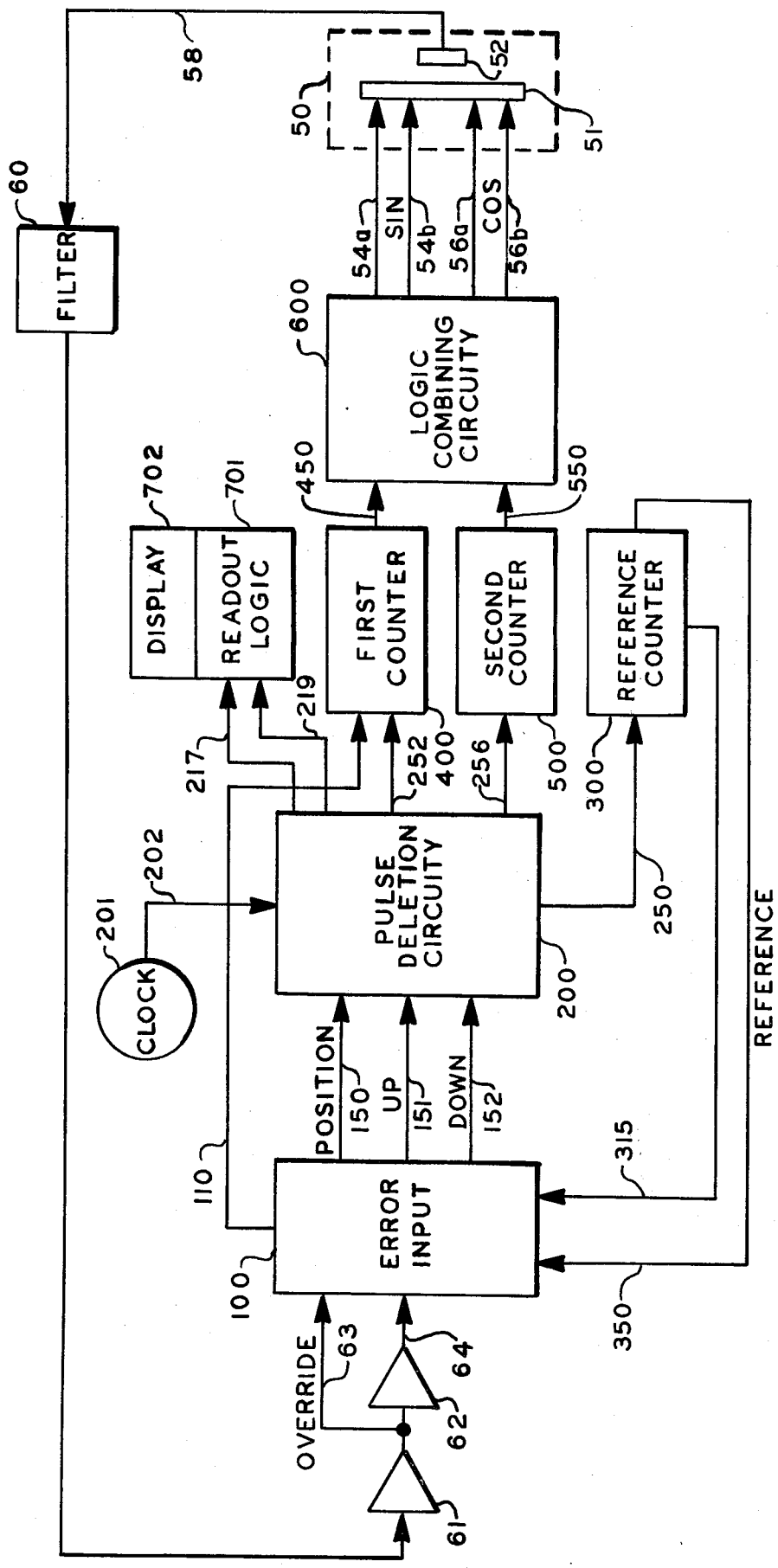
FIG. 1 is a block diagram of a specific embodiment of the present invention.

FIG. 1 shows a position measurement system with an analog-to-digital converter in accordance with the present invention. The system includes an Inductosyn position measuring transducer 50 having two relatively movable elements 51, 52. The converter supplies one of the elements 51 with analog signals on lines 54a, b and 56a, b, both having 4KHz. fundamental components with amplitudes respectively proportional to the sine and cosine of a command angle $\theta$, representative of a particular relative positioning between the elements 51, 52 within a 0.2 inch (5.08mm.) space cycle of the transducer 50. When the actual relative position of the transducer elements 51, 52 differs from the command angle $\theta$ an analog error signal is generated on line 58. The phase of the error signal indicates in which of two directions the error correction must be made (i.e., UP or DOWN).

The error signal is passed through a 4KHz. filter 60 and connected to amplifier stages 61 and 62. The output of amplifier stage 61 attains a predetermined value whenever the actual transducer positioning differs from the command angle $\theta$ by a given value (e.g. when the error signal equals two-fifths of its maximum possible amaplitude), and is connected to converter input circuitry 100 by line 63. The output of the second amplifier stage 62 is also connected to the converter input circuitry 100 by line 64. This output is standardized by amplifier 62 into a digital pulse indicative of whether the error signal is an UP state or DOWN state, i.e. in one of two possible directions the error corrections must be made.

The function of the converter input circuitry 100 is to sample the amplified error signal on line 64 and to generate a digital position pulse signal on line 150 whenever the error signal remains in the same state (UP or DOWN) for two successive sampling periods.

The input circuitry 100 also generates signals on lines 151 and 152 indicative of the direction of the position correction required, UP or DOWN, respectively. Also, whenever the output of the first amplifier stage 61 equals the predetermined value indicating that the positional error is relatively great, an "over-ride" mode is established, and the input circuitry 100 generates a number of correction pulses, rather than a single pulse, so that positional correction can be accelerated.

The position pulses on line 150 and the direction signals on lines 151 and 152 are connected to pulse deletion circuitry 200 which is also supplied with 4MHz. digital clock pulses from clock 201. The pulse deletion circuitry 200 functions to supply clock pulses to a reference counter 300 on line 250, deleting a clock pulse on the occurence of every other position pulse. The circuitry 200 also supplies clock pulses to first and second counters 400 and 500. One clock pulse is deleted from the pulse train supplied to the first counter 400 on line 252 whenever a position pulse occurs in a first (UP) state. A clock pulse is deleted from the pulse train supplied to the second counter 500 whenever a position pulse occurs in a second (DOWN) state.

The three counters 300, 400 and 500 each have a cyclical count range, and when supplied with their respective pulse trains from the pulse deletion circuitry the outputs from the final stages of the first and second counters 400, and 500 are rectangular waveforms relatively phase shifted by an amount proportional to the digital count difference between position pulses in UP and DOWN states. The output signal of the reference counter 300 on line 350 has a rectangular waveform, the phase of which is centered between the phases of the first and second counter outputs; the rising wavefront of the signal on line 350 is used by the converter input circuitry to effect the sampling of the error signal.

The first counter 400 also includes circuitry described hereinafter to insert a delay of 325 ns. (equivalent to 1.3 times one 250 ns. bit at a 4MHz. clock rate) in the output signals from the first counter 400 whenever the error signal switches from a DOWN to an UP state, as indicated by the signal supplied on line 110 from the error input circuitry 100. It is this delay, or shaft in the first counter output which changes the analog output signals to alter the command angle $\theta$ by a predetermined amount, thereby simulating a three-state error signal system operation.

The output from the final stages of the first and second counters 400 and 500 are supplied on lines 450 and 550, respectively, to logical combining circuitry 600 which, as described in the aforementioned U.S. Pat. No. 3,686,487, acts to produce analog output signals on lines 54a, 54b and 56a, 56b having pulse-width modulated rectangular waveforms, each including a fundamental frequency component having an amplitude proportional to a trigonometric function of the digital input to the converter (viz., sine and cosine of the command angle $\theta$). The analog output signals are supplied to the transducer 50 which responsively generates the error signal transmitted through the filter 60 and amplifiers 61 and 62 to the converter input circuitry 100 to form a closed loop system.

It will be understood by those skilled in the art that the converter apparatus of the present invention can be used for position measurement, position readout or position control when incorporated in systems with appropriate servo positioning means or readout indicators such as is described in the aforementioned U.S. Pat. No. 3,686,487.

FIG. 1 shows the position-measuring system connected to position readout circuitry 701 and a readout display 702 by lines 217 and 219 from the pulse deletion circuitry 200. Readout circuitry 701 is basically an up-down counter whose outputs are connected to a visual display 702. The inputs on lines 217 and 219 control, respectively, the incrementing and decrementing of the counter and its associated position readout display.

Detailed Description

Figure 2:
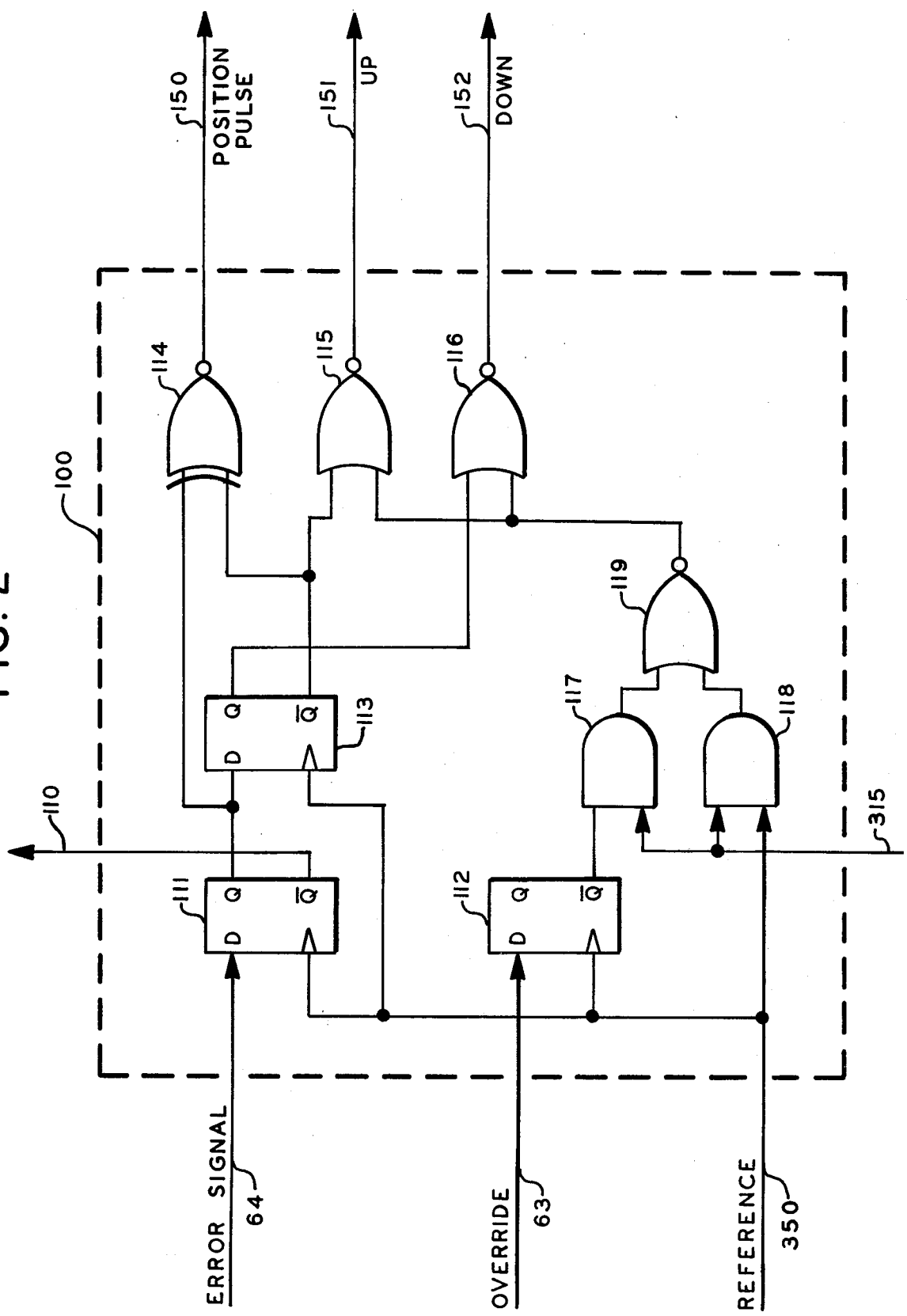
FIG. 2 is a schematic diagram of input circuitry of the embodiment of FIG. 1.

FIG. 2 shows the error input circuitry of the embodiment of the present invention. The error signal output of amplifier stage 62 is connected by line 64 to the D input of flip-flop 111. The "over-ride" output of amplifier stage 61 is connected on line 63 to the D input of another flip-flop 112. These flip-flops and others incorporated in the embodiment are D-type flip-flops such as type SN 7474 integrated circuits. Both flip-flops 111 and 112 have their clock inputs connected in line 350 which carries a 4KHz. square wave generated by the reference counter 300, as described herinafter. The Q output of flip-flop 111 is connected to the D input of a flip-flop 113 whose clock input is also connected to line 350. The Q output of flip-flop 111 and also the $\bar{Q}$ output of flip-flop 113 are connected to an EXCLUSIVE-OR gate 114. Flip-flop 111 samples the state of the error signal on line 64 for each pulse on line 350; and each pulse on line 350 shifts the contents of flip-flop 111 into flip-flop 113. The output of the gate 114 on line 150 is therefore a digital pulse indicative of the fact that the error signal input on line 64 has been in one direction (high or low, UP or DOWN) for two consecutive sampling pulses on line 350.

The $\bar{Q}$ output of flip-flop 112 is connected to one input of AND gate 117. The other input of gate 117 is connected by line 315 to a 400 KHz. square wave from reference counter 300. Another AND gate 118 has one input connected to the 4KHz. reference pulse on line 350 and the other input also connected to line 315. The outputs of AND gates 117 and 118 are connected to the inputs of a NOR gate 119 whose output goes to the inputs of NOR gates 115 and 116. The other input of NOR gate 115 is connected to the $\bar{Q}$ output of flip-flop 113; and the other input of NOR gate 116 in connected to the Q output of flip-flop 113.

Digital signals appear at the output of NOR gate 115 whenever the error signal as sampled by the last reference pulse on line 350 appears in an Up state; digital pulses appear at the output of NOR gate 116 whenever the previously sampled error signal is in a DOWN state. The occurence of an over-ride condition causes the output of flip-flop 112 to gate a 400 KHz. signal through gates 117 and 119 to the inputs of NOR gates 115 and 116, thereby multiplying by one hundred the effective number of counter stepping pulses input to the system, as described hereinafter. One pulse from the 400 KHz. signal on line 315 is passed through the NOR gates 115 and 116 during each sampling period.

Figure 3:
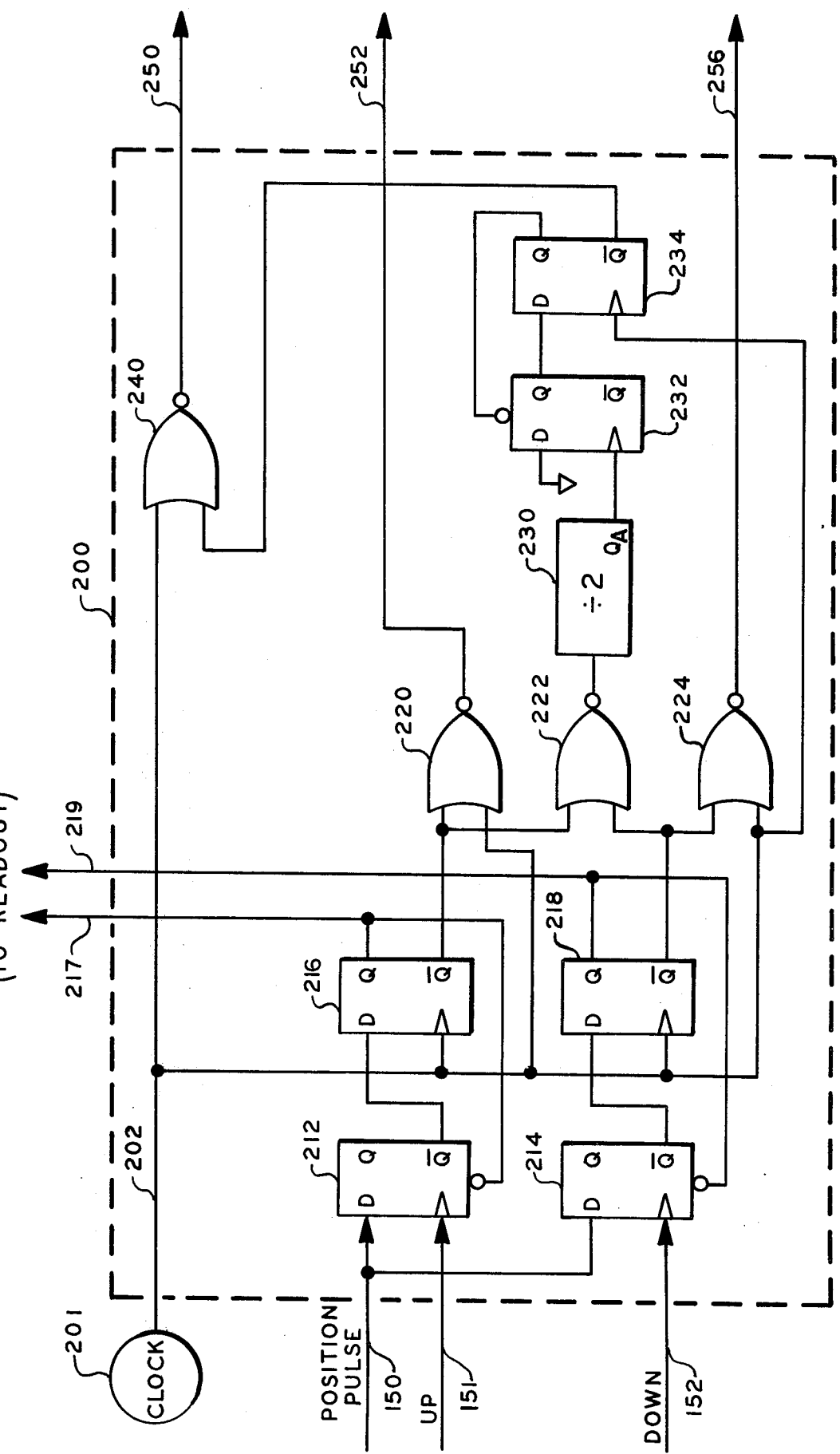
FIG. 3 is a schematic diagram of pulse deletion circuitry of said embodiment.

FIG. 3 depicts the pulse deletion circuitry 200 of the embodiment, and a 4 MHz. digital clock source 201. The position pulse output of the error input circuitry 100 on line 150 is connected to the D inputs of flip-flops 212 and 214. The clock input of flip-flop 212 is connected by line 151 to the UP state signal, and the clock input of flip-flop 214 is connected by line 152 to the DOWN state signal. The $\bar{Q}$ outputs of flip-flops 212 and 214 are connected to the D inputs of flip-flops 216 and 218, respectively. The clock inputs of flip-flops 216 and 218 are tied to the output of the 4 MHz. clock 201, which also feeds one input of each of NOR gates 220, 224, and 240. The Q outputs of flip-flops 216 and 218 are connected by lines 217 and 219 to the preset inputs of flip-flops 212 and 214, respectively. The signals on lines 217 and 219 are also transmitted to the readout logic 701 and display 702 to control the incrementing and decrementing of the readout.

The $\bar{Q}$ output of flip-flop 216 is tied to the other input of NOR gate 220 and also to one input of a NOR gate 222. The $\bar{Q}$ output of flip-flop 218 is connected to the other input of NOR gate 222 and to the other input of NOR gate 224. As aa consequence of this circuit arrangement the output of NOR gate 220 generates 4 MHz. clock pulses on line 252 with one pulse deleted whenever a position pulse is generated on line 150 in an UP state. Similarly, clock pulses are generated at the output of NOR gate 224 on line 256 with pulses deleted whenever position pulses are present on line 150 and the error signal is in a DOWN state.

The output of NOR gate 222 is connected to the clock input of a divide-by-two counter 230 (such as an SN 74196 integrated circuit). The $Q_A$ output of counter 230 is connected to the clock input of a flip-flop 232 whose D input is tied to ground. The Q output of flip-flop 232 goes to the D input of another flip-flop 234 which is clocked by the 4 MHz. clock signals on line 202. The Q output of flip-flop 234 is returned to the clear input of flip-flop 232, and the $\bar{Q}$ output of flip-flop 234 goes to the second input of NOR gate 240. The arrangement of counter 230 and flip-flops 232 and 234 allows standardized, synchronized clock pulses to appear at the output of gate 240 on line 250, with one clock pulse being deleted for every other position pulse generated on line 150.

Therefore, with the described circuit arrangement the reference counter 300 is continually incremented by 4 MHz. clock pulses, with one pulse deleted on the occurrence of every other position pulse while the first and second counters 400 and 500 are continually being incremented by 4 MHz. clock pulses, with one pulse being deleted from the first counter input whenever a position pulse is generated an UP state and one pulse being deleted from the second counter input whenever a position pulse is generated with a DOWN state. The two counter output signals on lines 450 and 550 shift phase relative to each other as a function of the number and direction of position pulses generated. Because one pulse is deleted from the input to the reference counter 300 for every other position pulse the phase of the reference counter output on line 350 remains centered between the first and second counter outputs so that phase walk between the counter ouputs is eliminated and a relatively high clock frequency can be retained for high speed tracking purposes. Also, since the three counters need only be incremented, no up-down counters are required and complexity in circuitry is minimized.

Figure 4:
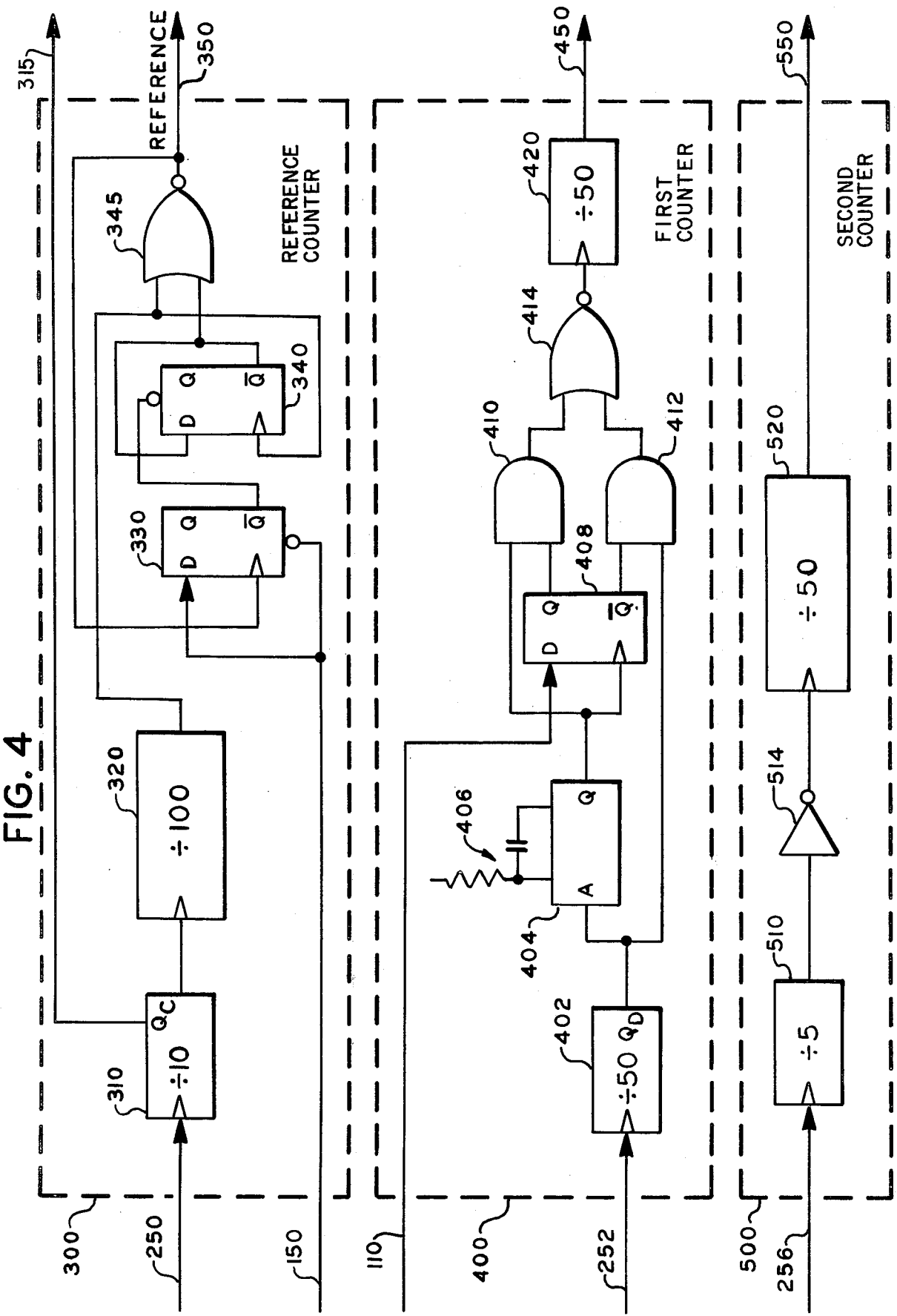
FIG 4 is a schematic diagram of counter circuitry of said embodiment.

FIG. 4 shows the three basic counters in the system: the reference counter 300, the first counter 400, and the second counter 500. The signal on line 250 is connected to the input of a divide-by-ten counter 310 (an SN 74192) whose Qc output is tied to the clock input of a divide-by-one-hundred counter 320 (such as two SN 74161 circuits connected in cascade). A 400 KHz.

signal from the counter 310 is taken on line 315 and returned to the error input circuitry 100 described in connection with FIG. 2.

The reference counter 300 also includes a flip-flop 330 whose D input and preset input are connected to the position pulse line 150. The $\overline{Q}$ output of flip-flop 330 is tied to the clear input of another flip-flop 340, whose $\overline{Q}$ output goes back to its own D input and also to one input of a NOR gate 345. The final output of the divide-by-one-hundred counter 320 is connected to the other input of NOR gate 345 and to the clock input of flip-flop 340. The output of NOR gate 345 on line 350 is returned to the clock input of flip-flop 330 and transmitted as the reference sampling signal to the error input circuitry 100.

The circuit configuration of flip-flops 330 and 340 and gate 345 provides for the generation of a 4 KHz. reference signal on line 350 whenever the error signal remains in a steady UP or DOWN state. However, whenever the error signal changes its directional state, the output of counter stage 320 is divided by two by flip-flop 340 to five a 2 Khz. reference signal on line 350 for sampling the error signal. This decreased sampling rate is continued until the error signal as sampled has maintained the same UP or DOWN directional state for two successive samples. The decreased sampling rate when the error signal direction is in a transitional phase greatly improves the stability and reliability of the position measurement system, so that, for example, flicker of the least significant position readout display digit is eliminated.

The first counter 400 has the signal on line 252 connected to the clock input of a divide-by-five counter 402 (such as an SN 74196 circuit) whose $Q_D$ output goes to the A input of a one-shot multivibrator 404 (an SN 74123) and to one input of an AND gate 412. The multivibrator 404 is provided with a resistor-capacitor combination 406 so that whenever its A input goes high the Q output of the multivibrator remains high for 325 ns., which is 1.3 times the 250 ns. period of the 4 MHz. clock. The Q output of the multivibrator 404 is connected to the clock input of a flip-flop 408 and to one input of an AND gate 410. The D input of flip-flop 408 is supplied on line 110 with the $\overline{Q}$ output of flip-flop 111 from the error input circuitry as shown in FIG. 2. The Q output of flip-flop 408 is tied to the other input of gate 410, and the $\overline{Q}$ output of flip-flop 408 goes to the second input of gate 412. Each output of AND gates 410 and 412 is connected to an input of a NOR gate 414, whose output is tied to the input of a divide-by-fifty counter 420 (such as two SN 74161 circuits connected in cascade). The output of the counter 420 appears on line 450.

When the error signal is sampled in a DOWN state the pulses on line 252 are divided down by the divider circuit 402 and are transmitted through gates 412 and 414 to the next counter circuit 420. However, whenever the error signal is in an UP state, as indicated by the level of the signal on line 110, flip-flop 408 is set and the pulses from the output of the divider circuit 402 do not pass directly to gates 412 and 414, but instead the delayed output signals from the multivibrator 404 are sent through gates 410 and 414 to the counter circuit 420. As a result, whenever the error signal is in an UP state the output from the counter 420 on line 450 is delayed by 325 ns. relative to the phase of reference counter output pulses on line 350.

The second counter 500 has an input on line 256 to the clock input of a divide-by-five counter 510 (an SN 74196 circuit). The output of counter 510 goes to an inverter 514 and the output of that inverter feeds a divide-by-fifty counter 520 (again, two SN 74161 circuits connected in cascade) to generate an output signal on line 550.

As a consequence of this counter arrangement the reference counter output on line 350 provides a 4 KHz. train of pulses. The first counter output on line 450 comprises a train of 16 KHz. pulses which are delayed by 325 ns. relative to the phase pulses on the reference counter ouput line 350 whenever the error signal is in an UP state. The second counter output on line 550 comprises a train of 16 KHz. pulses; these pulses are never delayed or shifted relative to the phase of the reference counter output pulses on line 350.

Figure 5:
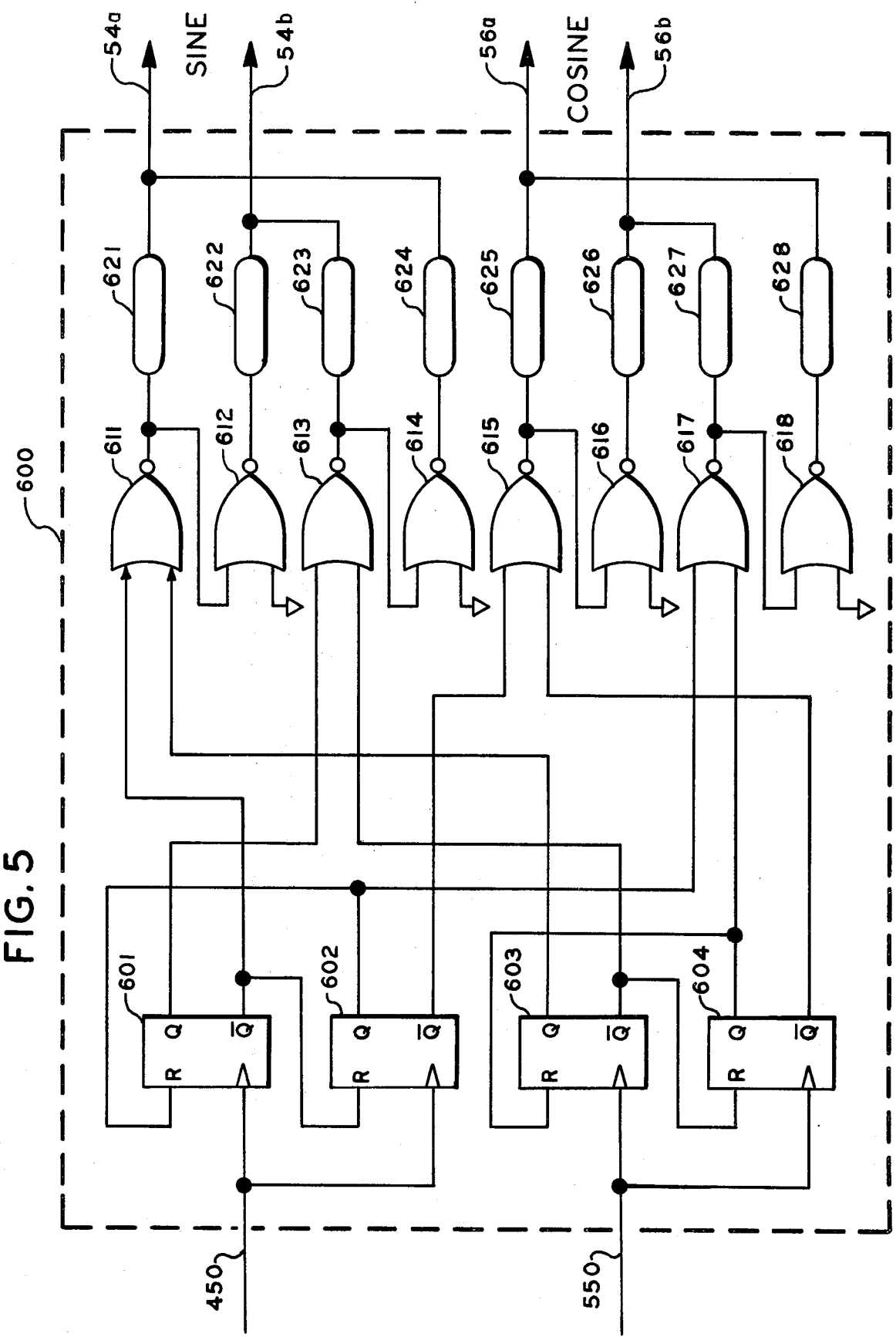
FIG. 5 is a schematic diagram of logical combining circuitry of said embodiment.

FIG. 5 shows the logical combination circuitry 600 which takes the 16 KHz. signals from the first and second counters 400 and 500 and responsively generates two pulse-width modulated analog signals having 4 KHz. fundamental frequency components proportional, respectively, to the sine and cosine of an angle $\theta$, where $\theta$ equals the number of digital input pulses n from amplifier stage 62 divided by the total count down range N of 2000 multiplied by 360°.

The logical combining circuitry 600 includes four flip-flops 601–604, eight NOR gates 611–618, and eight 30 ohm resistors 621–628. The output from the first counter 400 on line 450 is connected to the clock inputs of flip-flops 601–602. The Q output of flip-flop 601 goes to one input of NOR gate 613, and the $\overline{Q}$ output goes to one input of NOR gate 611 and to the D input of flip-flop 602. The $\overline{Q}$ output of flip-flop 602 is tied to one input of gate 615; the Q output goes to one input of gate 617 and to the D input of flip-flop 601.

The output from the second counter 500 on line 550 goes to the clock inputs of flip-flops 603 and 604. The Q output of flip-flop 603 is tied to the other input of gate 611, and the $\overline{Q}$ output of that flip-flop is connected to the other input of gate 613 and to the D input of flip-flop 604. The $\overline{Q}$ output of flip-flop 604 in connected to the other input of gate 615; the Q output goes to gate 617 and to the D input of flip-flop 603.

The output of gate 611 goes to one side of resistor 621 and to one input of gate 612. The output of gate 612 is tied to one side of resistor 622. The output of gate 613 is connected to one side of resistor 623 and to an input of gate 614, whose output is tied to one side of resistor 624. The output of gate 615 is tied to one side of resistor 625 and to one input of gate 616. The output of gate 616 goes to one side of resistor 626. The output of gate 617 is tied to one side of resistor 627 and to an input of gate 618, whose output goes to one side of resistor 628. The remaining inputs of gates 612, 614, 616 and 618 are tied to ground.

The other side of resistors 621 and 624 are joined by line 54a; the other sides of resistors 622 and 623 are tied together by line 54b. The analog signal corresponding to sine $\theta$ is generated across lines 54a, 54b. Similarly, the other side of resistors 625 and 628 are connected together by line 56a, and resistors 626, 627 are united by line 56b. The signal corresponding to cosine $\theta$ appears across lines 56a, 56b.

The theory and operation of such logical combining circuitry means are described in the previously mentioned U.S. Pat. No. 3,686,487.

Basically, however, flip-flops 601 and 602 form a Johnson twisted ring counter which divides the 16 KHz. signal on line 450 by 4 to give 4 KHz. signals at the output of flip-flop 601 and other 4 KHz. signals 90° out of phase with those signals at the respective outputs of flip-flop 602. Similarly flip-flops 603 and 604 also form a twisted ring counter to divide the signal on line 550 into 4 KHz. signals at the outputs of flip-flop 603 and other 4 KHz. signals at the outputs of flip-flop 604 90° out of phase i.e. in quadrature, with the signals at the respective outputs of flip-flop 603. The network of NOR gates 611–618 and resistors 621–628 is used to form the pulse-width modulated SINE and COSINE analog signal outputs on lines 54a–b and 56a–b, respectively, by ANDing the fundamental outputs from flip-flops 601 and 603 to give the SINE output, and ANDing the quadrature outputs from flip-flops 602 and 604 to generate the COSINE output signal.

Thus, NOR gate 611 essentially NORs the complementary outputs of flip-flops 601 and 603 to feed one side of the SINE output (54a), and NOR gate 613 NORs the true output of flip-flops 601 and 603 to the other side of the SINE output (54b). Gates 615 and 617 NOR the complementary and true outputs, respectively of the "quadrature" flip-flops 602 and 604 to supply the COSINE signal to lines 56a–b. The NOR gates 612, 614, 616 and 618 are connected as inverters to supply return paths for the SINE and COSINE output currents transmitted to the Inductosyn transducer windings. The SINE and COSINE pulse-width modulated signals so formed have a 4 KHz. fundamental frequency, the amplitude of the fundamental component of the SINE signal on lines 54a–b being proportional to the sine of the command angle θ, and the amplitude of the fundamental frequency component of the COSINE signal across lines 56a–b being proportional to cosine θ.

Although the described embodiment of the present invention simulates a three-state error input system by detecting an error signal directional transition and altering the width of pulse-width modulated analog output signals by an amount greater than the normal one-bit change on that condition, it will be recognized by those skilled in the art that the invention is not limited to position measuring systems having pulse-width modulated analog outputs. For example, U.S. Pat. No. 3,789,393 describes a position-measuring system with a digital-to-analog converter using both amplitude and pulse-width modulation to generate analog output signals. In that system the pulse amplitude component of the analog signal represents the fine (least significant) bits of the command position, and the pulse-width component of the signal represents the coarse (most significant) bits. The present invention can be used with such a system by altering the amplitude modulated component of the analog output by a predetermined amount (e.g. by an amount corresponding to a 1.3 bit change in command position) whenever the error signal changes directional state. Furthermore, it was found advantageous to augment the analog output of the described system by a 1.3 bit position change, however that figure is not critical and other amounts greater than a one-bit change can also be used.

The present invention finds particular application with high-speed digital tracking systems (such as that described in Tripp U.S. Pat. No. 3,673,395) which require the internal counter states of the digital-to-analog converter to be accurate at all times, including times of rapid positional change. Beacuse of the simulation of a three-state dead zone input configuration the states of the first and second counters respond accurately to the true position of the transducer even during high-speed tracking.

Finally, although the described embodiment reduces the error signal sampling rate by a factor of two whenever the error signal has not remained in one directional state for two successive sampling times it will be evident that the sampling rate can be reduced by other factors on such conditions.

What is claimed is:

1. A system including a position-measuring transducer which generates an error signal as a function of a positional state of said transducer and as a function of analog signals input to said transducer, said error signal having two directional states, the system comprising:
   a. input means for periodically sampling said error signal and for responsively generating digital signals representative of the directional state of said error signal;
   b. converter means responsive to said digital signals for generating said analog signals, said analog signals being changed by a uniform given amount upon the occurrence of each of said digital signals; and
   c. means responsive to said digital signals for changing said analog signals by a predetermined fixed amount greater than said uniform given amount whenever said error signal changes directional state.

2. A system according to claim 1 further comprising:
   means responsive to said digital signals for reducing the rate of sampling said error signal whenever said error signal has not remained in one directional state for two successive sampling times.

3. A system responsive to the relative space position of first and second relatively movable members of a position measuring transducer, said transducer producing an output error signal as a function of a relative space position of said members and as a function of analog signals input to said transducer, said error signal having two directional states, said system comprising:
   input circuitry adapted to receive said error signal and to responsively generate digital signals representative of the directional state of said error signal;
   a source of clock pulses;
   pulse deletion circuitry responsive to said clock pulses and to said digital signals to generate first and second stepping pulse trains, the difference in the number of pulses between said first and second stepping pulse trains being a function of the directional state of said error signal;
   first and second counters, responsive to said first and second trains of stepping pulses, respectively, for counting and registering said stepping pulses cyclically through a count range, said first counter additionally having means for delaying count registering signals from said first counter for a predetermined delay time whenever said error signal is in a first of said two directional states; and
   means for logically combining said count registering signals from said first counter with count registering signals from said second counter to form said analog signals.

4. In a position-measuring system digital to analog converter apparatus for supplying an analog signal representative of a given position to a position measurement transducer, said transducer responsively generating an error signal representative of the direction of the difference between said given position and an actual position of said transducer, the apparatus comprising:

a. a source of clock pulses;
b. means responsive to said error signal for generating a source of digital pulses representative of the direction of said error signal;
c. circuit means responsive to said clock pulses and digital pulses for generating first and second trains of stepping pulses, the difference in the number of pulses between said first and second trains being a function of said error signal;
d. first and second counters responsive to said first and second trains of stepping pulses, respectively, for counting and registering said stepping pulses cyclically through a count range, said first counter additionally having means responsive to said digital pulses for delaying count registering signals from said first counter for a predetermined delay time when said error signal is in a given direction; and
e. means for logically combining said count registering signals from said first counter with count registering signals from said second counter to form said analog signal.

5. Apparatus according to claim 4 further comprising a reference counter responsive to said clock pulses for counting and registering said clock pulses.

6. Apparatus according to claim 5 further comprising:
input circuitry responsive to said error signal and to periodic count registering signals from said reference counter for generating one of said digital input pulses whenever said error signal is in one direction for two consecutive periodic signals.

7. Apparatus according to claim 5 wherein said circuit means further comprises means for inhibiting the incrementing of said reference counter by a clock pulse upon the occurence of every other input pulse; and wherein said first train of pulses is composed of said clock pulses, one clock pulse being deleted from said first train upon the occurrence of an input pulse in a first of two states; and wherein said second train of pulses is composed of said clock pulses, one clock pulse being deleted from said second train upon the occurrence of an input pulse in a second of two states.

8. Apparatus according to claim 4 wherein said predetermined delay time is greater than one period of said clock pulses.

9. Apparatus according to claim 4 wherein said predetermined delay time is between one and two periods of said clock pulses.

10. In a position-measuring system digital to analog converter apparatus for supplying an analog signal representative of a given position to a position measurement transducer, said transducer responsively generating an error signal representative of the direction of the difference between said given position and an actual position of said transducer, the apparatus comprising:

a. a source of clock pulses;
b. means responsive to said error signal for generating a source of digital pulses representative of the direction of said error signal;
c. circuit means responsive to said clock pulses and digital pulses for generating first and second trains of stepping pulses, the difference in the number of pulses between said first and second trains being a function of said error signal;
d. first and second counters responsive to said first and second trains of stepping pulses, respectively, for counting and registering said stepping pulses cyclically through a count range;
e. a reference counter responsive to said clock pulses for counting and registering said clock pulses;
f. circuit means for inhibiting the incrementing of said reference counter by a clock pulse upon the occurrence of every other input pulse; and
g. means for logically combining said count registering signals from said first counter with count registering signals from said second counter to form said analog signal;
wherein said first train of pulses is composed of said clock pulses, one clock pulse being deleted from said first train upon the occurrence of an input pulse in a first of two states; and wherein said second train of pulses is composed of said clock pulses, one clock pulse being deleted from said second train upon the occurrence of an input pulse in a second of two states.

11. A system including a position-measuring transducer which generates an error signal as a function of analog signals transmitted to said transducer by converter circuitry responsive to said error signal, said error signal having two directional states, the system comprising:
first means for periodically sampling said error signal at a sampling rate and for sensing the directional state of said error signal, said sampling rate being a first system parameter;
second means responsive to said first means and connected to said converter circuitry for changing said analog signals by a predetermined amount upon the sampling of said error signal, said predetermined amount being a second system parameter; and
third means responsive to said first means and connected to said first and second means for changing the value of at least one of said two system parameters upon a directional change of said error signal and for restoring said parameter to its initial value upon said error signal remaining in one directional state for a given number of consecutive samples.

* * * * *